(12) United States Patent
Liu

(10) Patent No.: US 8,390,017 B2
(45) Date of Patent: Mar. 5, 2013

(54) OPTICAL DEVICE FOR SEMICONDUCTOR BASED LAMP

(75) Inventor: Keh Shium Liu, Hsinchu Hsien (TW)

(73) Assignee: Pinecone Energies, Inc., Tortola (VG)

( * ) Notice: Subject to any disclaimer, the term of this patent is extended or adjusted under 35 U.S.C. 154(b) by 0 days.

(21) Appl. No.: 13/449,506

(22) Filed: Apr. 18, 2012

(65) Prior Publication Data

US 2012/0211790 A1 Aug. 23, 2012

Related U.S. Application Data

(62) Division of application No. 12/837,365, filed on Jul. 15, 2010.

(51) Int. Cl.
*H01L 33/60* (2010.01)

(52) U.S. Cl. ............... 257/98; 257/79; 257/99; 257/100; 257/E33.055; 257/E33.056; 257/E33.059; 257/E33.06; 257/E33.067

(58) Field of Classification Search ............... 257/79, 257/98, 99, 100, E33.055, E33.056, E33.059, 257/E33.06, E33.067
See application file for complete search history.

(56) References Cited

U.S. PATENT DOCUMENTS

| 2,254,961 | A | * | 9/1941 | Harris | 362/327 |
| 5,898,267 | A | * | 4/1999 | McDermott | 313/512 |
| 6,578,989 | B2 | * | 6/2003 | Osumi et al. | 362/298 |
| 6,679,621 | B2 | | 1/2004 | West et al. | |
| 7,080,924 | B2 | | 7/2006 | Tseng et al. | |
| 7,083,313 | B2 | | 8/2006 | Smith | |
| 7,153,002 | B2 | | 12/2006 | Kim et al. | |
| 7,329,029 | B2 | | 2/2008 | Chaves et al. | |
| 7,524,098 | B2 | | 4/2009 | Vennetier et al. | |
| 7,931,390 | B2 | * | 4/2011 | Allen et al. | 362/255 |
| 2006/0076568 | A1 | | 4/2006 | Keller et al. | |
| 2009/0296387 | A1 | | 12/2009 | Reisenauer et al. | |
| 2009/0310368 | A1 | | 12/2009 | Incerti et al. | |

* cited by examiner

*Primary Examiner* — Jay C Kim
(74) *Attorney, Agent, or Firm* — Huffman Law Group, P.C.

(57) ABSTRACT

An optical device for a semiconductor based lamp includes a base and a semiconductor based light-emitting device mounted on the base. A transparent body encapsulates the semiconductor based light-emitting device. A reflective surface is in contact with the transparent body and covers a predetermined region on a top of the transparent body. The reflective surface has an opening. At least a portion of the transparent body protrudes through the opening in the reflective surface. Light emitted from the semiconductor based light-emitting device transmits upwardly through the opening in the reflective surface.

15 Claims, 7 Drawing Sheets

US 8,390,017 B2

OPTICAL DEVICE FOR SEMICONDUCTOR BASED LAMP

PRIORITY CLAIM

This patent application is a divisional of U.S. patent application Ser. No. 12/837,365 entitled "OPTICAL DEVICE FOR SEMICONDUCTOR BASED LAMP" to Liu filed on Jul. 15, 2010.

BACKGROUND

1. Field of the Invention

The present invention relates generally to electrical lighting devices, and, more particularly, to an electrical lighting device utilizing light emitting diodes (LEDs).

2. Description of Related Art

A light-emitting diode (LED) is a semiconductor diode based light source. When a diode is forward biased (switched on), electrons are able to recombine with holes within the device, releasing energy in the form of photons. This effect is called electroluminescence and the color of the light (corresponding to the energy of the photon) is determined by the energy gap of the semiconductor. When used as a light source, the LED presents many advantages over incandescent light sources. These advantages include lower energy consumption, longer lifetime, improved robustness, smaller size, faster switching, and greater durability and reliability.

However, using an LED as a light source has its disadvantages. One of the disadvantages is that the light emitted from an LED chip concentrates in a direction normal or perpendicular to the surface of the LED chip, i.e., LED light is strong in the upright direction and drastically diminished in the sideway directions. In order to make a LED light more like a traditional incandescent light source with uniform light emitting intensity in all directions, reflectors have been used to redirect the LED beam from upright to sideways. However, redirecting light merely sacrifices light in the upright direction in favor of sideway directions and may not be an efficient uniform wide-angle light source.

As such, what is desired is an LED light bulb that can uniformly emit light in most directions from the LED chip.

SUMMARY

In certain embodiments, an optical device for a semiconductor based lamp includes a base; a semiconductor based light-emitting device mounted on the base; a transparent body encapsulating the semiconductor based light-emitting device; and a reflective surface in contact with the transparent body and covering a predetermined region on a top of the transparent body, the reflective surface having an opening. At least a portion of the transparent body protrudes through the opening in the reflective surface. Light emitted from the semiconductor based light-emitting device transmits upwardly through the opening in the reflective surface. In some embodiments, the semiconductor based light-emitting device includes one or more light-emitting diodes (LEDs).

BRIEF DESCRIPTION OF THE DRAWINGS

Features and advantages of the methods and apparatus of the present invention will be more fully appreciated by reference to the following detailed description of presently preferred but nonetheless illustrative embodiments in accordance with the present invention when taken in conjunction with the accompanying drawings in which.

Figure 1:
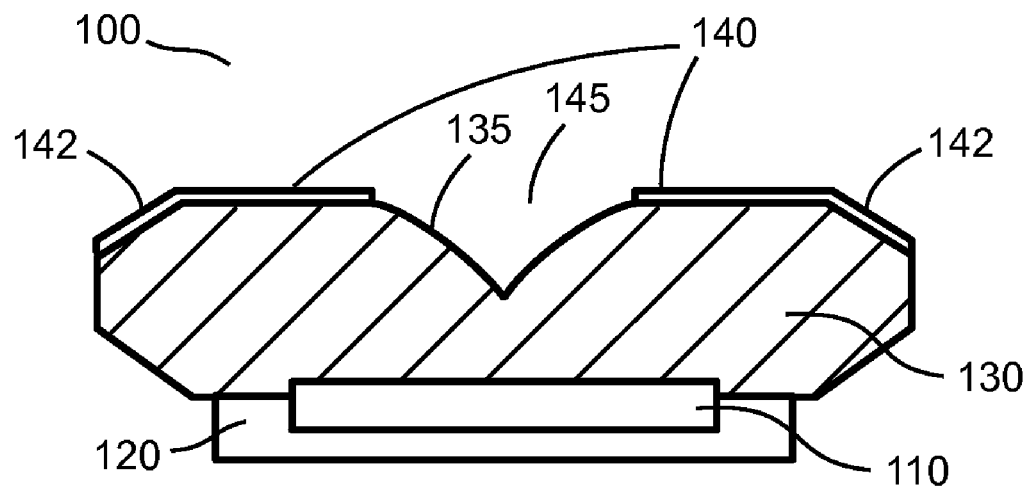
FIG. 1 is a cross-sectional view of an embodiment of an optical device for a semiconductor based lamp.

While the invention is susceptible to various modifications and alternative forms, specific embodiments thereof are shown by way of example in the drawings and will herein be described in detail. The drawings may not be to scale. It should be understood that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF EMBODIMENTS

Certain embodiments described herein disclose an optical device for a semiconductor based lamp. The optical device spreads a semiconductor based lamp's directional light to directions of a wide angle so that the light emitting pattern of the semiconductor based lamp resembles that of a traditional incandescent light bump.

FIG. 1 is a cross-sectional view of an embodiment of optical device 100 for a semiconductor based lamp. The optical device 100 comprises a semiconductor based light emitting device 110 mounted on a base 120. A common type of the semiconductor based light emitting device 110 is light-emitting diodes (LEDs). The light emitting device 110 can be formed by either one LED or an array of LEDs. The light emitting surface of the light emitting device 110 is encapsulated by a transparent body 130. A reflective surface 140 is then formed on the top of the transparent body 130. As shown in FIG. 1, reflective surface 140 may have a portion that is parallel to base 120. Reflective surface 140 may be in contact with transparent body 130 and cover a predetermined region on a top of the transparent body. The reflective surface 140 may have a slanted portion 142 at an outer ring of the reflective surface 140. For example, slanted portions 142 may be end portions of reflective surface 140 that slant downwards. Optimally the reflective surface 140 is part of the top surface of the transparent body 130 that mirror reflects light from the light-emitting device 110 to a wide angle with high light intensity. The reflective surface 140 can be formed by plating a metal layer or by adhering a thin layer of sheet metal on top of the transparent body 130.

Referring to FIG. 1 again, the reflective surface 140 has an opening 145 that exposes approximately center portion of the transparent body 130 and hence center area of the light emitting device 110. The opening 145 allows light from the light-emitting device 110 to shine directly out of the transparent body 130.

As shown in FIG. 1, a boundary 135 of transparent body 130 in the area of opening 145 has a special concave contour (e.g., the transparent body 130 has a recessed region at an area exposed by opening 145), which is designed, together with the reflective surface 140, to reflect some of the light from the light-emitting device 110 to lateral directions due to an optical phenomenon called "total internal reflection".

Figure 2:
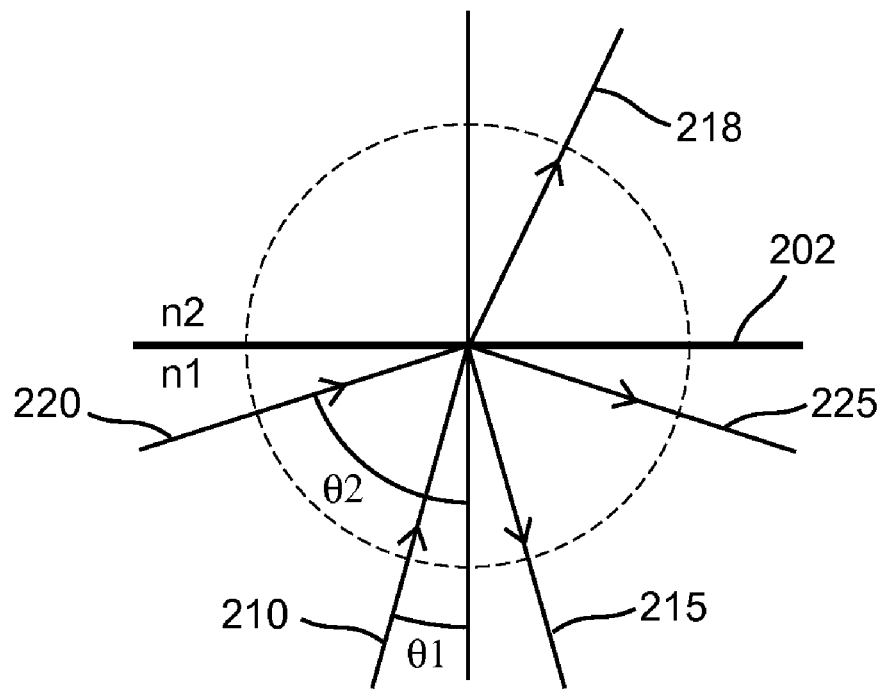
FIG. 2 illustrates the working mechanism of the optical device shown in FIG. 1.

FIG. 2 illustrates the mechanism of the total internal reflection. When light crosses a boundary 202 between materials with different refractive indices (n1 and n2), the light beam 210 (at angle 1 less than a critical angle) will be partially refracted 218 at the boundary surface 202, and partially reflected 215. However, if the angle of incidence is 2, which is greater (i.e. the ray is closer to being parallel to the boundary) than the critical angle—the angle of incidence at which light is refracted such that it travels along the boundary—then the light 220 will stop crossing the boundary 202 altogether and instead be totally reflected back 225 internally (e.g., total internal reflection occurs). This can only occur where light travels from a medium with a higher (n1=higher refractive index) to one with a lower refractive index (n2=lower refractive index). For example, it will occur when passing from glass to air, but not when passing from air to glass. The material for making the transparent body 130 can be glass or transparent polymer such as acrylics, polycarbonate, poly (vinyl chloride), polyethylene terephthalate (PET).

Figure 3A:
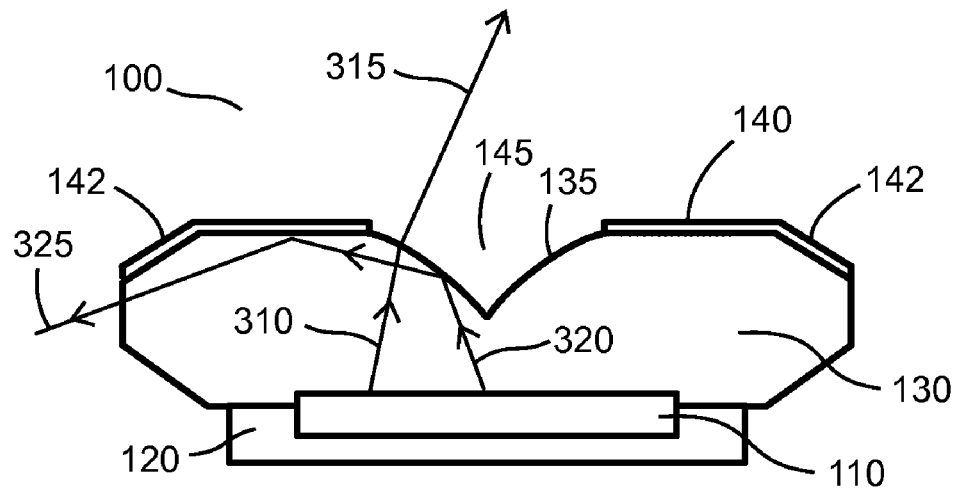
FIG. 3A illustrates light travel paths in the optical device shown in FIG. 1.

FIG. 3A illustrates light travel paths in the optical device 100 shown in FIG. 1. Referring to FIG. 3A, a light beam 310 emitted from the outer area of the light-emitting device 110 hits the boundary 135 with a small angle of incidence, some of the light 310 is refracted into a light beam 315. Such refractive light 315 is the light that is transmitted directly from the light-emitting device 110.

Referring to FIG. 3 again, another light beam 320 emitted from the center area of the light-emitting device 110 hits the boundary 135 with a large angle of incidence to incur total internal reflection. As a result, the light beam 320 bounces off the boundary 135, then the reflective surface 140, and finally is transmitted out of the transparent body 130 in a lateral direction as a light beam 325. The contour design of the boundary 135 along with the size of the opening 145 determines the relative amount of the light transmitted directly to the upright direction—represented by the light beam 315, and the relative amount of the light transmitted to the lateral direction—represented by the light beam 325. In certain embodiments, the size of the opening 145 is smaller than that of the light-emitting device 110.

Figure 3B:
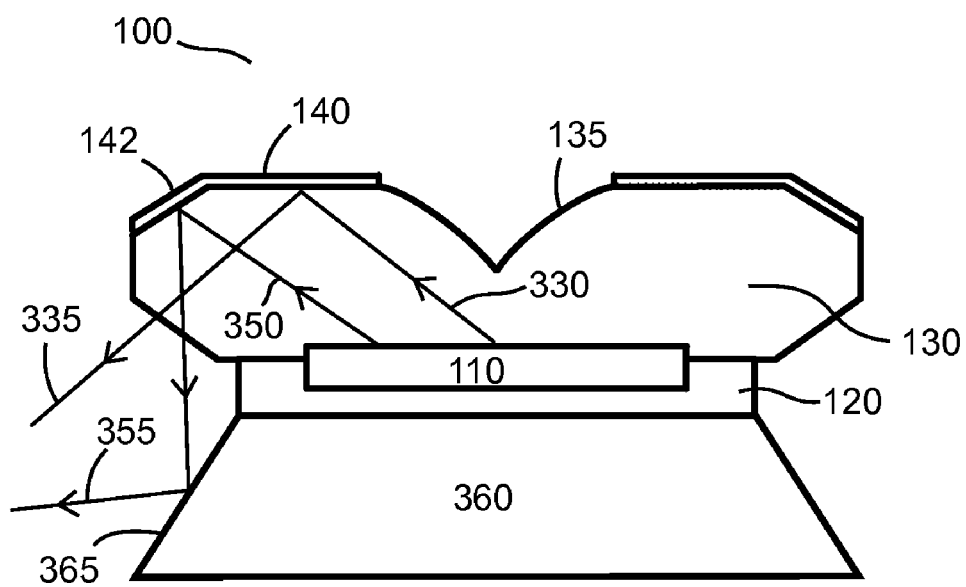
FIG. 3B illustrates an addition to the optical device shown in FIG. 1 and associated light travel paths therein.

FIG. 3B illustrates an addition to the embodiment of the optical device 100 shown in FIG. 1 and associated light travel paths therein. Referring to FIG. 3B, the light emitting device 100 is elevated by a platform 360. The platform 360 has slanted, reflective side walls 365. A light beam 330 hitting the reflective surface 140 is reflected into a lateral lighting beam 335. Another light beam 350 hitting the slanted region 142 of the reflective surface 140 is reflected downward therefrom, then reflected again by the reflective side wall 365 of the platform 360, and ends up with a lateral light beam 355 with less downward angle.

Figure 4A:
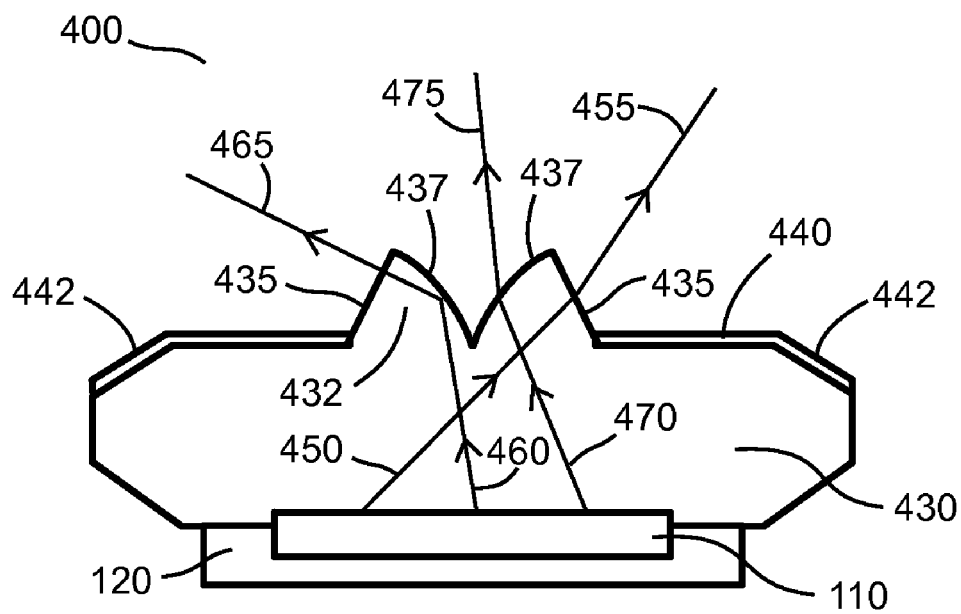
FIGS. 4A and 4B illustrate alternative embodiments from the embodiment of the optical device shown in FIG. 1.
Figure 4B:
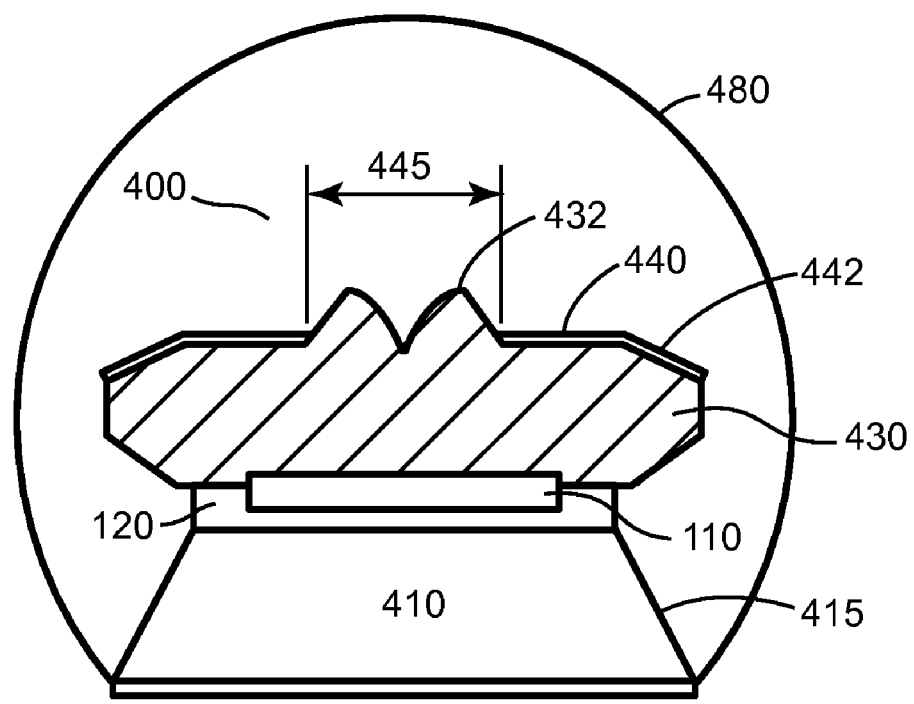

FIGS. 4A and 4B illustrate alternative embodiments from the embodiment of optical device 100 shown in FIG. 1. Referring to FIG. 4A, an optical device 400 has the same light emitting device 110 as the embodiment of optical device 100 of FIG. 1. Optical device 400, however, includes a transparent body 430 that encapsulates the light emitting device 110. Transparent body 430 has a portion that protrudes through reflective surface 440 (e.g., extends above the reflective surface) at or near an opening in the reflective surface. For example, at least a portion of the transparent body 430 (e.g., a center portion of the transparent body) may extend (protrude) through the opening in the reflective surface 440. In certain embodiments, the portion of the transparent body 430 extends through a portion of the reflective surface 440 that is parallel to the base 120 of light emitting device 110 (e.g., the opening in the reflective surface is in a portion of the reflective surface parallel to the base). Reflective surface 440 may include slanted portions 442 at the outer ring of the reflective surface. Slanted portions 442 may be end portions of reflective surface 440 that slant downwards.

A cross-section of the protruding center portion includes two convex regions 432 bordered by boundaries 435 and 437. The boundary 435 faces away from the center, and may be designed to be straight. The boundary 437 faces toward the center, and may be designed to be curved. The two convex regions formed by boundaries 435 and boundaries 437 may be symmetrical about a center axis of the opening in the reflective surface 440 (e.g., the convex regions are symmetrical about a center axis of the portion of the transparent body that protrudes through the opening in the reflective surface). A light beam 460 is total-internal reflected by the curved boundary 437 into a light beam 465 out of the transparent body 430 and out through the opening in the reflective surface 440. The curved boundary 437 may function similarly to the concave boundary 135 shown in FIG. 3A. A light beam 450 is refracted through the straight boundary 435 and out through the opening in the reflective surface 440 into a light beam 455. The angles and shapes of the boundaries 435 and 437 may be adjusted to optimize the light emitting pattern of the optical device 400.

Referring to FIG. 4B, the optical device 400 has a frosted semi-transparent cover 480 that encloses the entire optical device 400. The frosted semi-transparent cover 480 enhances the uniformity of the emitted light.

Figure 5A:
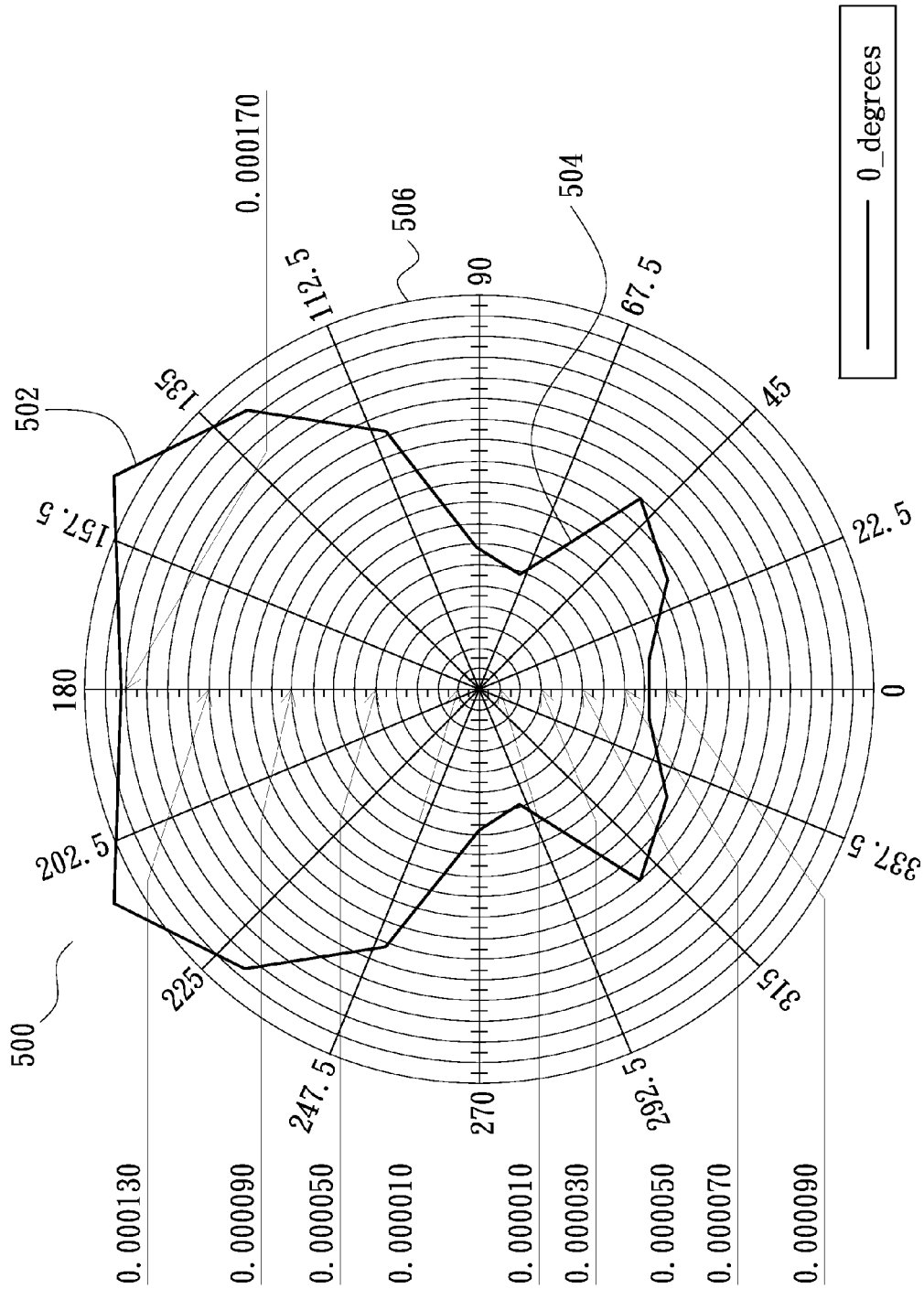
FIGS. 5A-5D illustrate simulation results of the LED lamps.
Figure 5B:
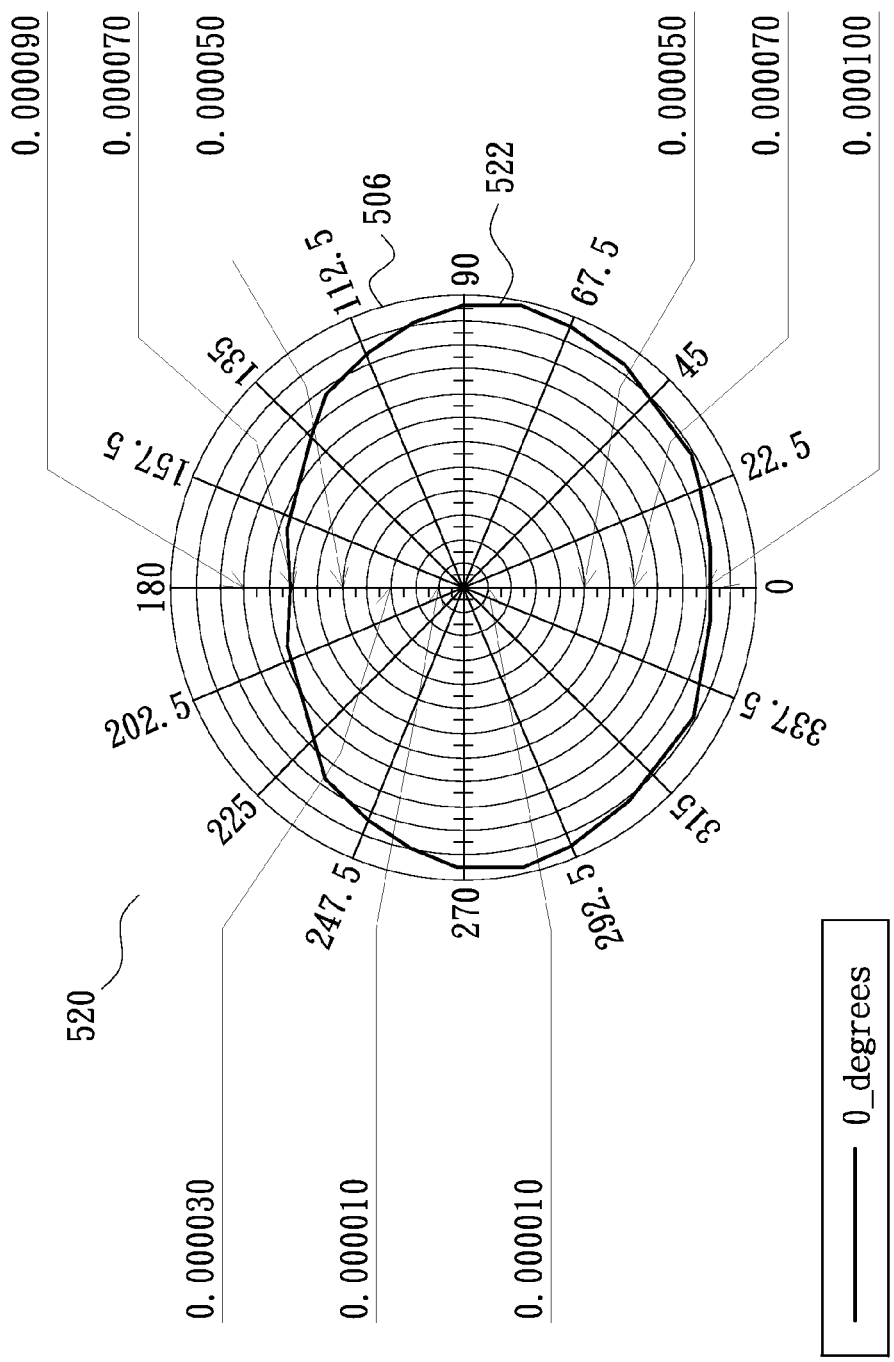

FIGS. 5A and 5B illustrate simulation results of the LED lamp based on the embodiment depicted in FIG. 3B. Referring to FIG. 5A, a circular polar plot 500 shows far-field distribution (light intensity distribution) 502 and 504 on circular angular scale 506, with off-axis angle, with zero denoting the on-axis direction, and 180 degree the opposite direction, totally backward. This is possible for those embodiments having some sideways extension of the transparent body and/or the reflective surface so that 180 degree is unimpeded by the source. Referring back to FIG. 3B, a diameter of the LED device 110 is 20 mm. A diameter of the transparent body 130 is 38 mm. A distance between a top of the transparent body 130 and the surface of the LED device 110 is 8 mm. The far-field distribution 502 shows that light intensity below the LED device 110 has fairly large intensity. The far-field distribution 504 shows that light is also emitted to above the LED device 110.

Referring to FIG. 5B, a far-field distribution 520 is obtained when a frosted cover similar to the frosted cover 480 shown in FIG. 4B is placed over the LED lamp of FIG. 3B. The far-field distribution 522 shows that the light emitting pattern is close to a circle which means that light is emitted from the LED lamp uniformly in all directions.

Figure 5C:
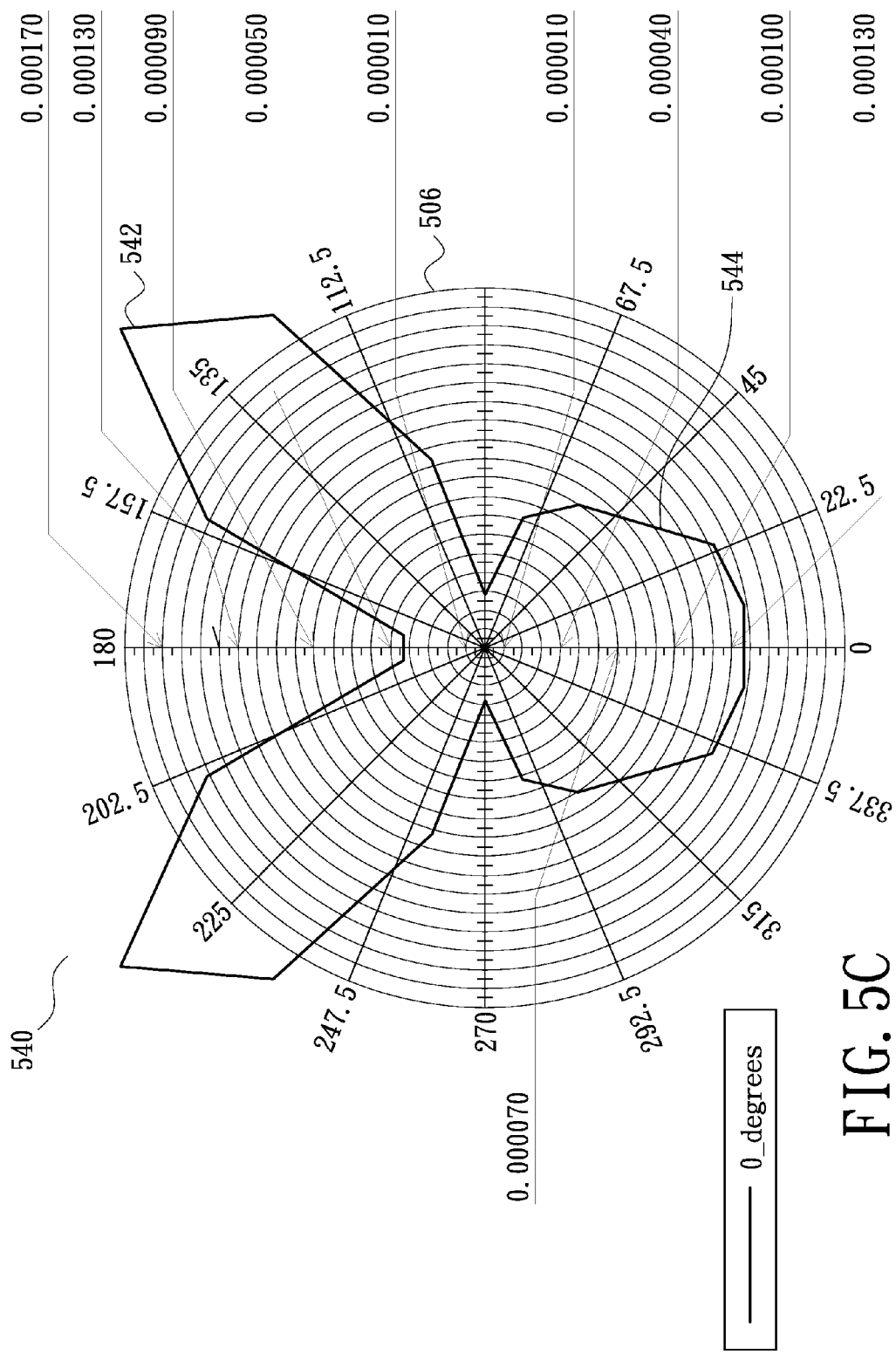
Figure 5D:
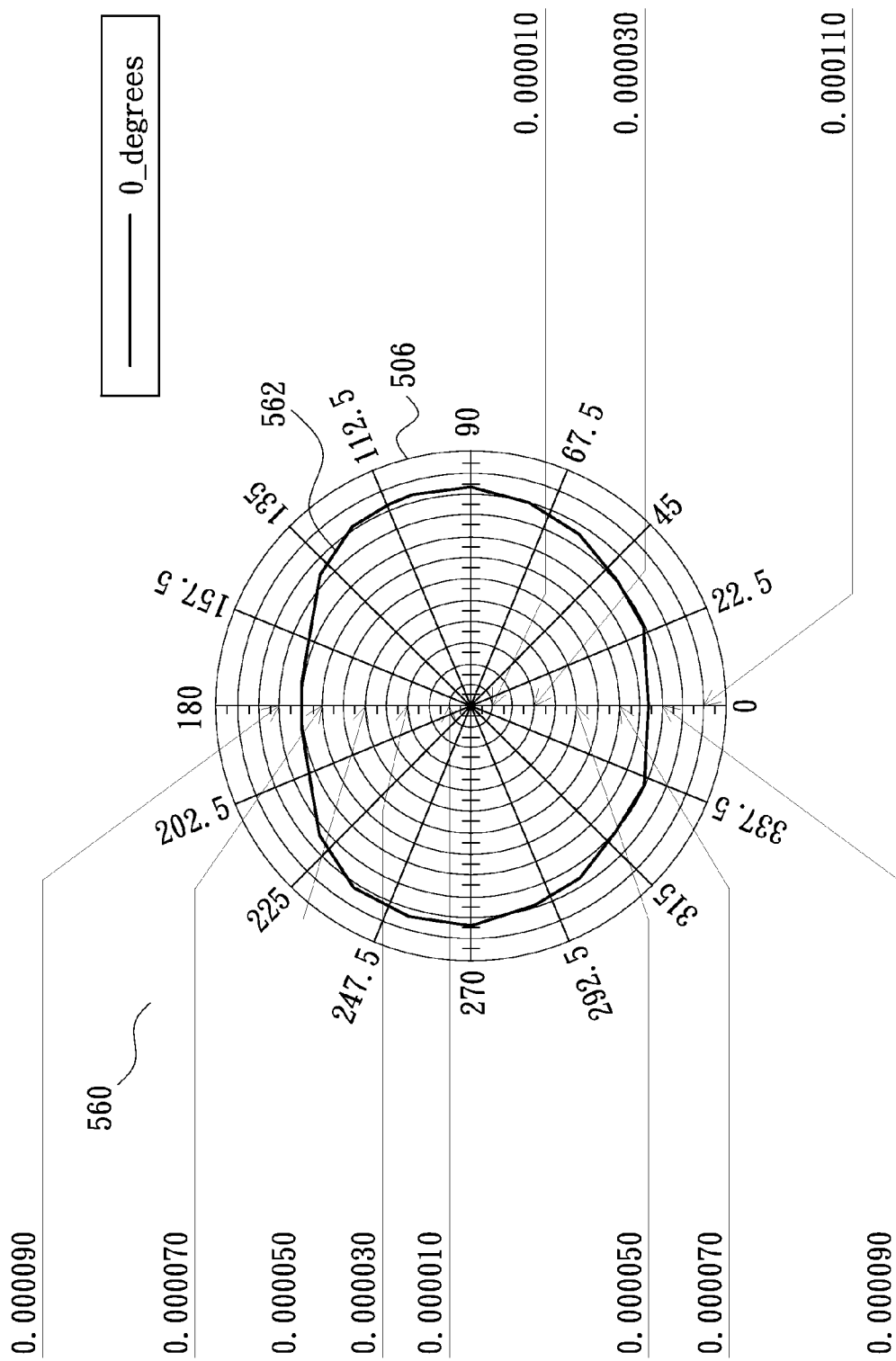

FIGS. 5C and 5D illustrate simulation results of the LED lamps based on FIGS. 4A and 4B, respectively. Referring to FIG. 5C, circular polar plot 540 shows far-field distribution (light intensity distribution) 542 and 544 on circular angular scale 506, with off-axis angle, with zero denoting the on-axis direction, and 180 degree the opposite direction, totally backward. Referring to FIG. 4A, a diameter of the LED device 110 is 20 mm. A diameter of the transparent body 130 is 38 mm. A distance between a top of the transparent body 130 and the surface of the LED device 110 is 11.83 mm. The far-field distribution 542 shows that light intensity at about 135 and 225 degree angle above the LED device 110 is very high. The far-field distribution 544 shows that light is also emitted to above the LED device 110.

Referring to FIG. 5D, a far-field distribution 560 is obtained when the frosted cover 480 is placed over the LED lamp as shown in FIG. 4B. The far-field distribution 562 shows that the light emitting pattern is close to a circle which means that light is emitted from the LED lamp uniformly in all directions.

The present invention is directed to methods and systems of material fabrication. More particularly, the invention provides a rotation system and related method for forming epitaxial layers of semiconductor materials. Merely by way of example, the invention has been applied to metal-organic chemical vapor deposition, but it would be recognized that the invention has a much broader range of applicability.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. An optical device for a semiconductor based lamp, the optical device comprising:
   a base;
   a semiconductor based light-emitting device mounted on the base;
   a transparent body encapsulating the semiconductor based light-emitting device; and
   a reflective surface in contact with the transparent body and covering a predetermined region on a top surface of the transparent body, the reflective surface having an opening in a portion of the reflective surface parallel to the base;
   wherein at least a portion of the transparent body protrudes through the opening in the reflective surface;
   wherein light emitted from the semiconductor based light-emitting device transmits upwardly through the opening in the reflective surface.

2. The optical device of claim 1, wherein the opening in the reflective surface is at or near a center of the reflective surface.

3. The optical device of claim 1, wherein the portion of the transparent body protruding through the opening in the reflective surface is a center portion of the transparent body.

4. The optical device of claim 1, wherein the transparent body is secured to the base.

5. The optical device of claim 1, wherein the transparent body is made of a material selected from the group consisting of glass and polymer.

6. The optical device of claim 1, wherein end portions of the reflective surface are slanted downward.

7. The optical device of claim 1, wherein the reflective surface comprises a plated reflective material on the top surface of the transparent body.

8. The optical device of claim 1, wherein the portion of the transparent body protruding through the opening includes two convex regions.

9. The optical device of claim 8, wherein the two convex regions are symmetrical about a center axis of the opening in the reflective surface.

10. The optical device of claim 9, wherein each of the two convex regions has a first boundary and a second boundary, and the first boundary faces away from the center axis and is designed to be straight, and the second boundary faces toward the center axis and is designed to be curved.

11. The optical device of claim 1, wherein at least part of the portion of the transparent body protruding through the opening totally internally reflects light emitted by the semiconductor based light-emitting device during use.

12. The optical device of claim 1 further comprising a frosted semi-transparent cover enclosing the base and the transparent body.

13. An optical device for a semiconductor based lamp, the optical device comprising:
   a base;
   one or more light-emitting diodes (LEDs) mounted on the base;
   a transparent body encapsulating the one or more LEDs; and
   a reflective surface in contact with the transparent body and covering a predetermined region on a top surface of the transparent body, the reflective surface having an opening in a portion of the reflective surface parallel to the base;
   wherein at least a portion of the transparent body protrudes through the opening in the reflective surface;
   wherein light emitted from the one or more LEDs transmits upwardly through the opening in the reflective surface.

14. The optical device of claim 13, wherein the opening in the reflective surface is at or near a center of the reflective surface.

15. The optical device of claim 13, wherein the portion of the transparent body protruding through the opening in the reflective surface is a center portion of the transparent body.

* * * * *